United States Patent
Chien

(10) Patent No.: US 6,225,871 B1
(45) Date of Patent: May 1, 2001

(54) VOLTAGE CONTROLLED CMOS OSCILLATOR

(75) Inventor: Hwey-Ching Chien, San Diego, CA (US)

(73) Assignee: Prominenet Communications, Inc., San Diego, CA (US)

( * ) Notice: Subject to any disclaimer, the term of this patent is extended or adjusted under 35 U.S.C. 154(b) by 0 days.

(21) Appl. No.: 09/499,122

(22) Filed: Feb. 7, 2000

(51) Int. Cl.⁷ .................................................. H03B 5/08
(52) U.S. Cl. ................... 331/117 FE; 331/36 C; 331/117 R; 331/167; 331/117 FE; 331/176
(58) Field of Search ............ 331/176, 66, 117 R, 331/117 FE, 167, 36 C, 113 R, 144, 177 R Primary Examiner—Arnold Kinkead
(74) Attorney, Agent, or Firm—H. C. Lin Patent Agent

(57) ABSTRACT

The frequency of oscillation of two cross-coupled CMOS inverters with a parallel LC tank connected between the two drains can be varied by a control voltage which varies the capacitance value of the tank circuit. The gate-to-source capacitance is used as the variable capacitance. The gate-to-source capacitance is varied by changing the dc gate voltage, which can be effected by either changing the dc current through the inverters or by varying the dc voltage across the inverters. The control voltage may also be made to vary with temperature such that the free running frequency of the oscillator is held constant with varying temperature.

15 Claims, 6 Drawing Sheets

VOLTAGE CONTROLLED CMOS OSCILLATOR

BACKGROUND OF THE INVENTION (1) Field of the Invention

This invention relates to variable frequency oscillator, the frequency of which is controllable, particularly a complementary MOS oscillator.

(2) Description of the Related Art

Voltage controlled oscillator (VCO) is widely used in the phase locked loop of a frequency synthesizer. In such an application, the frequency of the VCO must lock in with a reference frequency, which is customarily generated from a crystal oscillator. In such a system, the crystal frequency is compared with the free running frequency of the VCO. When the two frequencies are not in lock, an error signal is generated. This error signal is used to change the frequency of the VCO until the two frequencies are locked.

A widely used element used in the variable frequency oscillator is a varactor. The varactor is a reverse-biased diode and the junction capacitance varies according to the voltage applied. A varactor diode is similar to the emitter junction of a bipolar transistor. In a CMOS structure, an emitter like junction is not available. To incorporate such a junction requires extra processing and area, hence is more costly.

A requirement for the phase locked loop to operate satisfactorily is that the free running frequency of the VCO must be within the lock range of the reference frequency. If the free running frequency is too far off the reference frequency and outside the lock range, the phase-locked loop may not be able to lock in with the reference frequency. The free running frequency of the VCO is effected by the operating temperature of the phase locked loop. VCO may not be able to lock in the reference frequency as temperature changes.

SUMMARY OF THE INVENTION

An object of this invention is to eliminate the use of a varactor in a voltage controlled CMOS oscillator. Another object of this invention is to stabilize the free running frequency of the voltage controlled oscillator over a wide range of temperature. Still another object is to fabricate a more cost effective voltage controlled oscillator.

These objects are achieved by varying the gate capacitance of CMOS transistors to vary the frequency. The gate capacitance is varied by varying the gate voltages or the drain currents of the CMOS transistors. By changing the drain current, the transconductance of the transistor and hence the Miller capacitance at the gate of transistors is changed. The gate capacitance is connected in parallel with an inductor to form a resonant circuit for the CMOS oscillator, which oscillates at the resonant frequency of the resonant circuit.

To stabilize the free running frequency of the oscillator, a control voltage, which is temperature sensitive, is used to control the VCO in addition to that derived from the phase comparator.

DETAILED DESCRIPTION OF THE INVENTION

Figure 1:
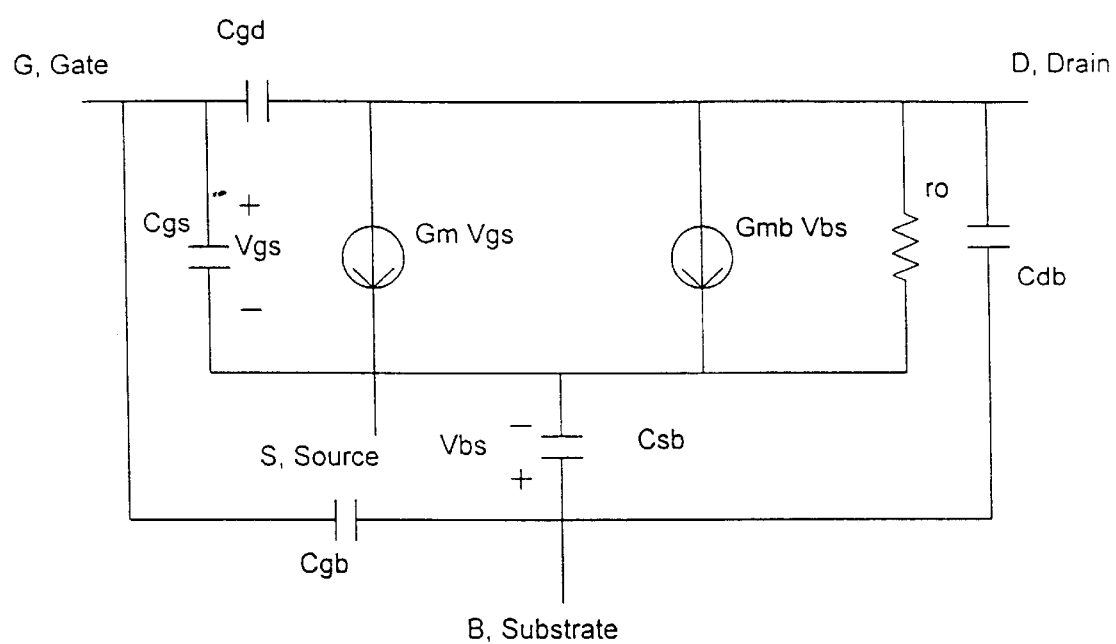
FIG. 1 shows the equivalent circuit of an MOS transistor.

FIG. 1 shows the equivalent circuit of an MOS transistor (MOSFET). There are two capacitors associated with the gate G of the MOSFET, the gate-to-source capacitance Cgs and the gate to drain capacitance Cgd. These capacitances are functions of the gate voltage.

The gate capacitance Cg has two components:

$$Cg = Cgs + (1 + gmR_L)Cgd \qquad (1)$$

where Cgs is the gate-to-source capacitance, Cgd is the gate-to-drain capacitance, gm is the transconductance and $R_L$ is the load resistance. The second component, $(1+gmR_L)$ Cgd is known as the Miller capacitance and is likely to be the dominant capacitance when the load resistance is high, such as the parallel LC resonant impedance. The transconductance gm increases as the dc drain current increases. If the load resistance remains constant as in the case of a parallel LC tank circuit, the Miller capacitance $(1+gmR_L)$ Cgd increases as the dc current increases. This gate capacitance variation with dc drain current is utilized in this invention. The variation of drain current Id with gate voltage is given as follows:

$$Id = Kp(Vg - Vt)^2 \qquad (2)$$

where Kp is a transconductance parameter and Vt is the threshold voltage of the MOSFET. Thus by changing the gate voltage, the drain current also changes.

Figure 2:
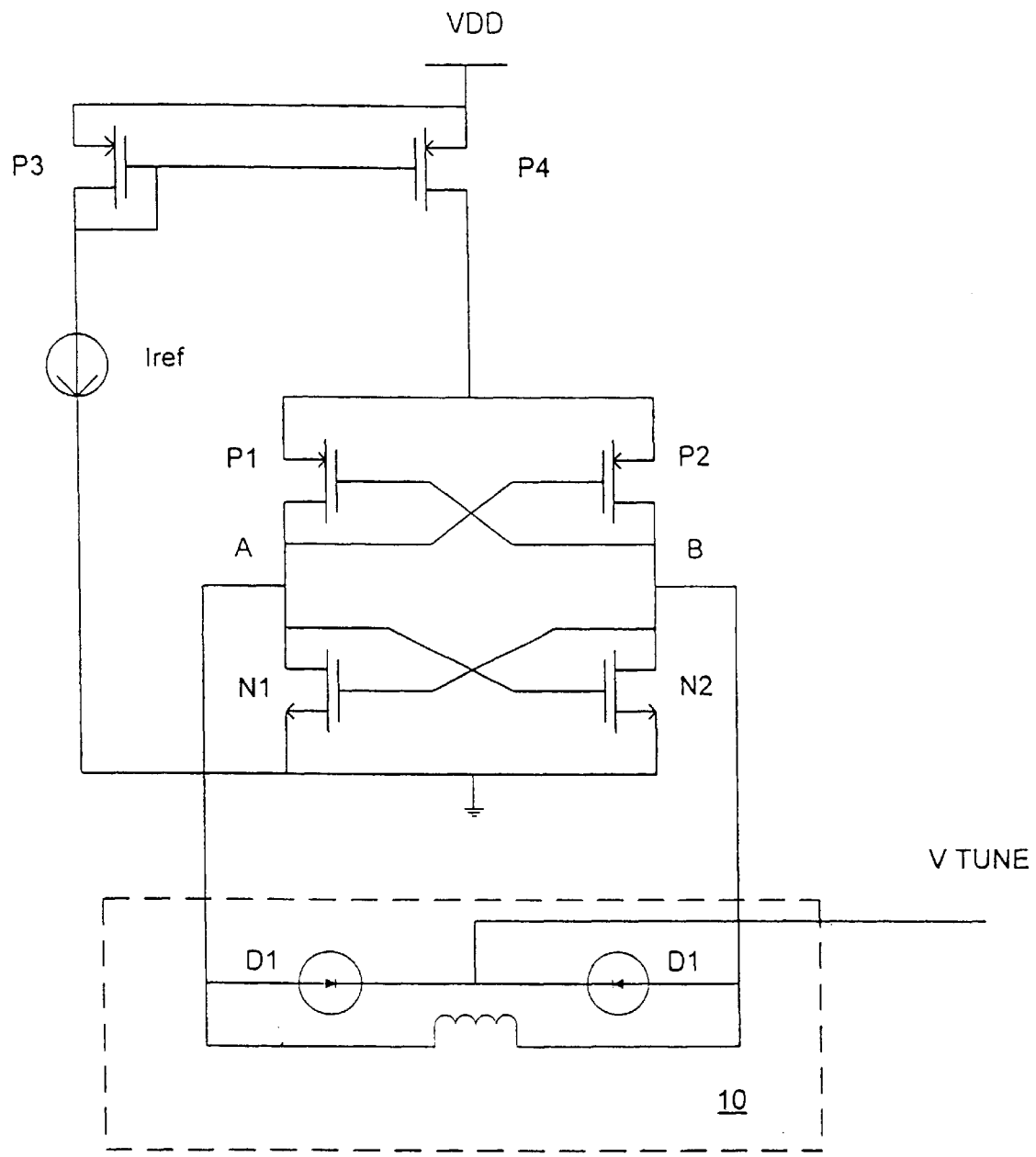
FIG. 2 shows a prior art voltage controlled oscillator (VCO) circuit using a varactor for tuning.

FIG. 2 shows a conventional VCO circuit using a varactor to control the frequency. Two CMOS inverters P1, N1 and P2, N2 are cross-coupled by connecting the common drain of the first inverter to the common gate of the second inverter and vice versa The cross-coupled inverters constitute a multivibrator. The two inverters are fed in parallel from a current mirror with PMOS P3 and P4 with a reference current of Iref. When a tank circuit of parallel inductor L and capacitor C is connected between the common drains A and B of the two inverters, the multivibrator becomes an astable multivibrator or a free running oscillator. The free running frequency of the oscillator is the resonant frequency of the parallel LC tank circuit. When it is desired to vary the frequency of the oscillator, conventional method is to connect two varactor diode D1 and D2 in parallel with the inductor L to form an external or on-chip tank circuit 10. A control voltage Vc is applied to the common cathode of the two varactor diodes D1 and D2. When the control voltage Vc is applied, the dc voltage across the varactor diode is changed, thereby changing the capacitance of the varactors, hence the frequency of oscillation. The output voltage of the oscillator can be sensed from nodes A and/or B. As pointed out earlier, varactors have some shortcomings.

Figure 3:
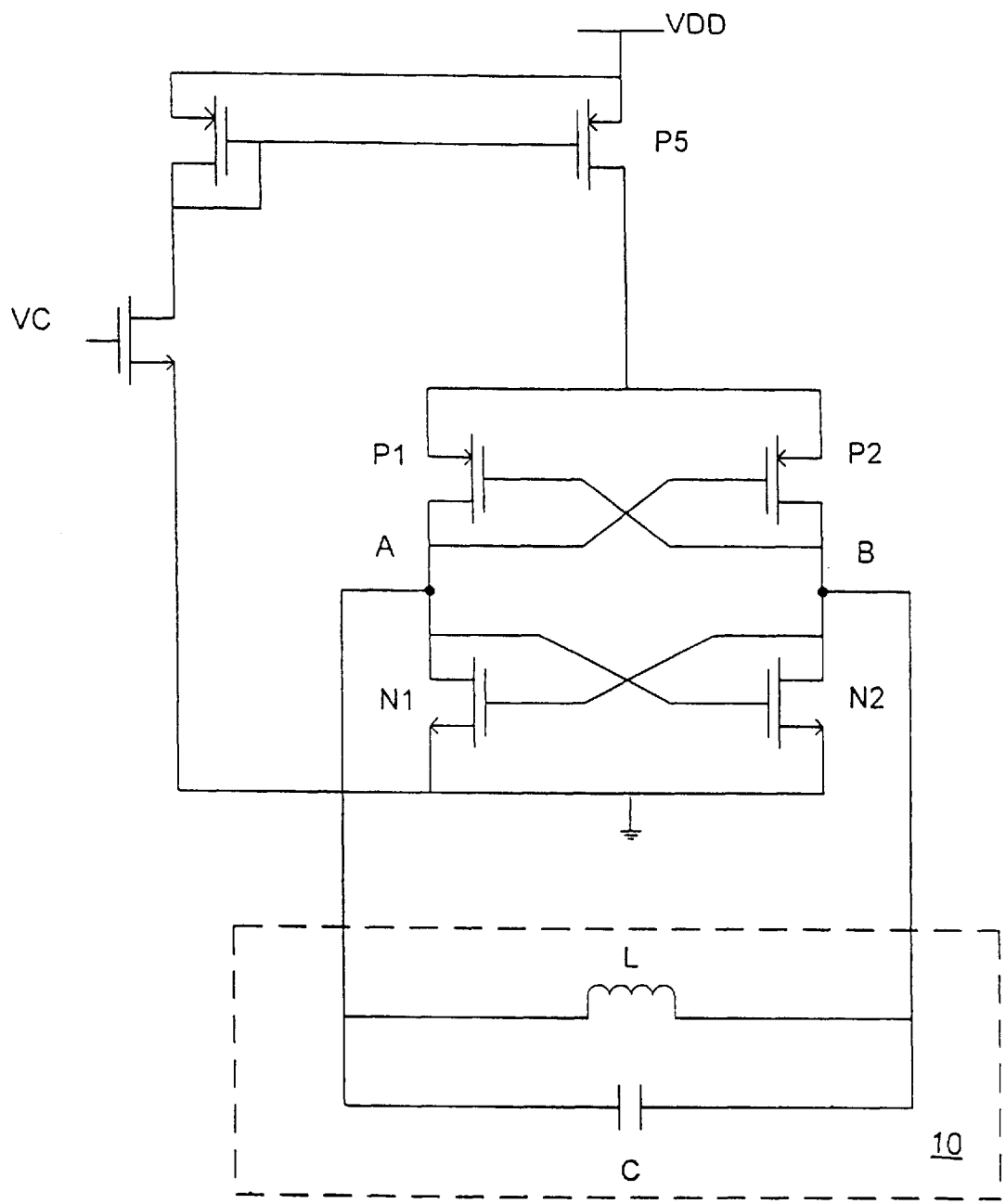
FIG. 3 shows a variable frequency oscillator based on the present invention.

The basic circuit of this invention is shown in FIG. 3. The circuit is similar to FIG. 2 except that the varactor is eliminated from the tank circuit 10. Instead of using a fixed reference current Iref as in FIG. 2, the current from the current mirror P3 and P4 is varied or tunable. A NMOS N3 furnishes the drain current to the current mirror P4 and P3. When a control voltage Vc is applied to the gate of N3, the drain current varies to vary the current of the current mirror P3 and P4. When the drain current increases, the transconductance gm also increases. Then, the Miller capacitance at the gate also increases. Note that the series gate capacitance Cgp1 and Cgp2 are connected in parallel with the inductor L to form the tank circuit 10. Thus, when the drain current increases, the resonant frequency is decreased, as controlled by Vc.

Figure 4:
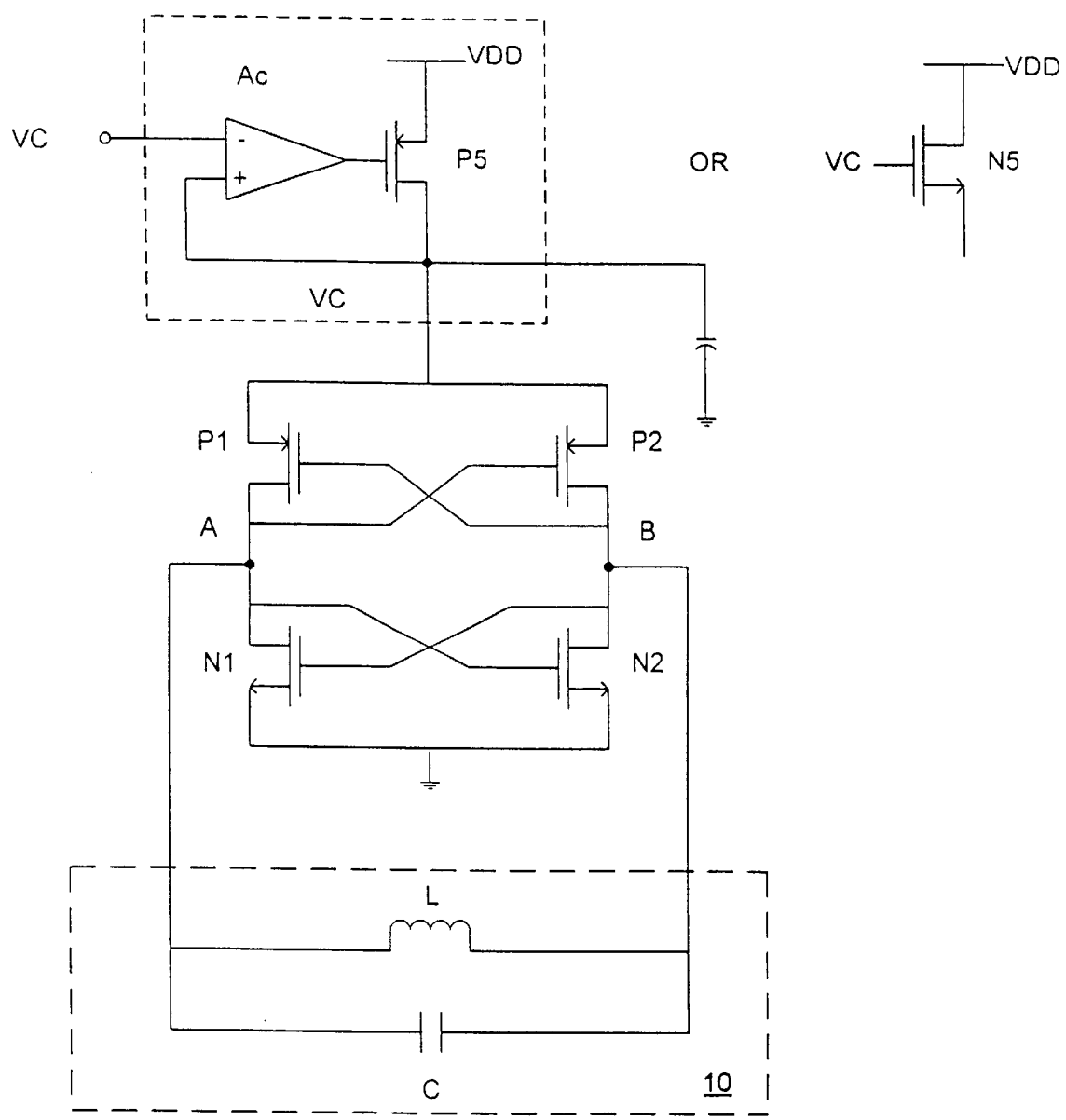
FIG. 4 shows another embodiment of the oscillator of the present invention.

FIG. 4 shows another embodiment of the present invention. In this embodiment, the two inverters P1, N1 and P2, N2 are fed from a voltage source. This voltage source comprises a voltage follower using an operational amplifier Ac and a PMOS P5. The drain of P5 follows the control input volt Vc, because of the inverting input V− and the non-inverting input voltage V+ of a high gain operational amplifier Ac must be nearly the same in an operational amplifier. When the control voltage Vc appears across the cross-coupled inverters P1, N1 and P2, N2, the common drain voltage at nodes A and B is nearly equal to Vc/2 if the PMOS and NMOS of the inverters are symmetrical, As Vc changes, drain voltages at nodes A and B also change. A change in node voltages at nodes A and causes the dc drain currents of N1, N2 to increase with respect to ground, and also the drain currents of P1, P2 to increase. When the gate voltage increases, the drain currents increase. Thus the control voltage can change the frequency of oscillation, such that when the control voltage Vc increases, the frequency of the oscillator decreases. It should be noted that Ac and P5 can be replaced by an NMOS source follower to achieve similar function.

While the control voltage Vc in FIG. 4 is derived from the phase comparator in a phase locked loop, Vc is not limited to a control voltage derived from a phase comparator. For instance, Vc can also be derived from a temperature sensor. The transconductance gm of a MOSFET is temperature dependent. As temperature increases, gm decreases because of lowering electron or hole mobility. On the other hand, an increase in temperature decreases the threshold voltage Vt in equation (2), and tends to increase the current Id and hence the transconductance. Depending on which factor dominates, the frequency of oscillation may either increase or decrease with temperature but is unlikely to remain constant. If the change in Vt dominates, the frequency decreases with increasing temperature due to increased Miller capacitance. To compensate for the increase of the Miller capacitance, the control voltage Vc should have a negative temperature coefficient so as to decrease the drain current, hence the transconductance of the MOSFETs as temperature increases.

Figure 5:
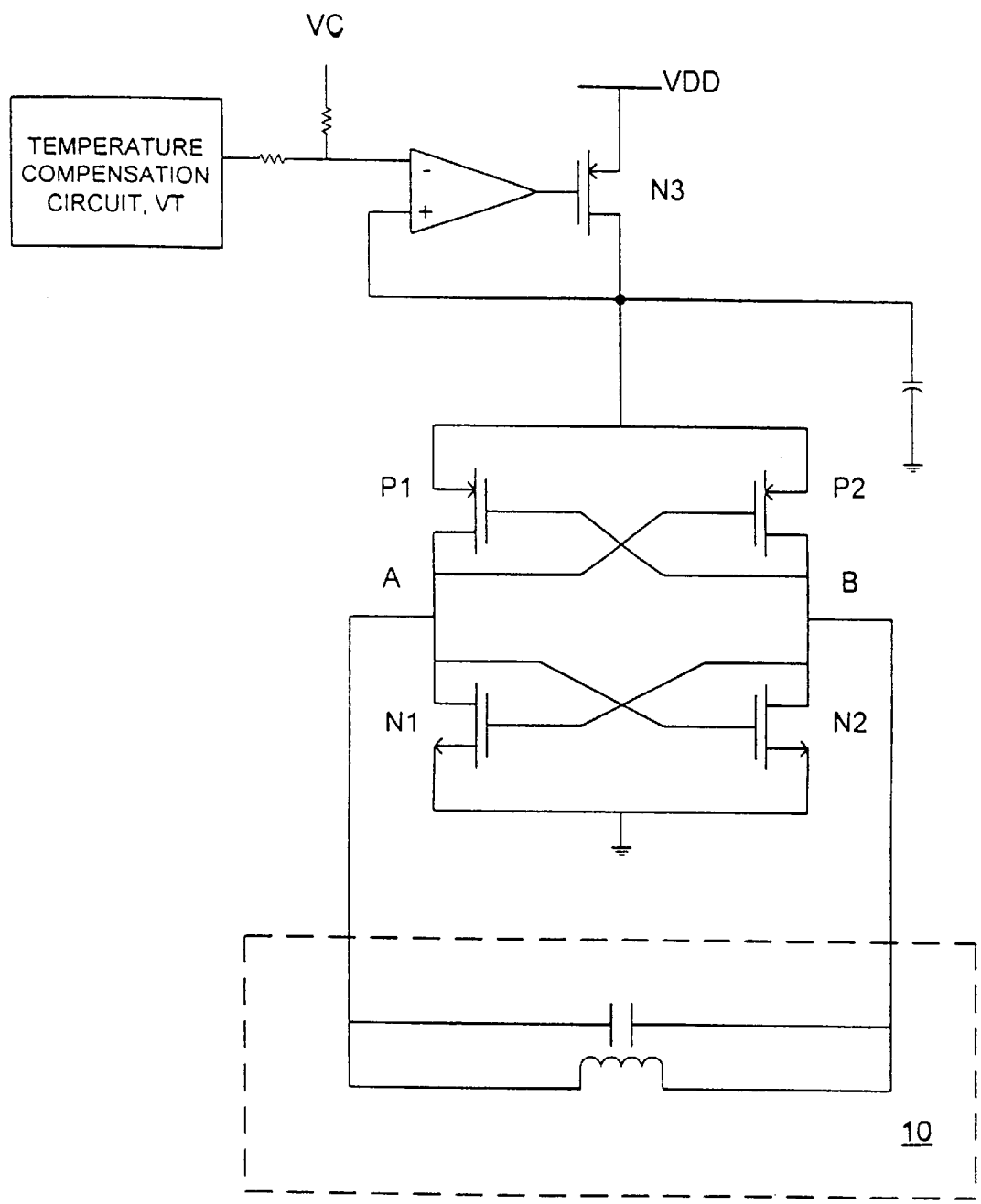
FIG. 5 shows an oscillator with a free running frequency which is stabilized with respect to temperature variations.

FIG. 5 shows another embodiment of the present invention in which the frequency of oscillation of the VCO is controlled by the control voltage Vc derived from the phase comparator in a phase locked loop as described in connection with FIG. 2, as well as a temperature dependent control voltage $V_T$. Both the control voltage Vc and the temperature control voltage $V_T$ are summed at the inverting input terminal of the operational amplifier Ac. Then both Vc and $V_T$ can change the frequency of the VCO.

Figure 6:
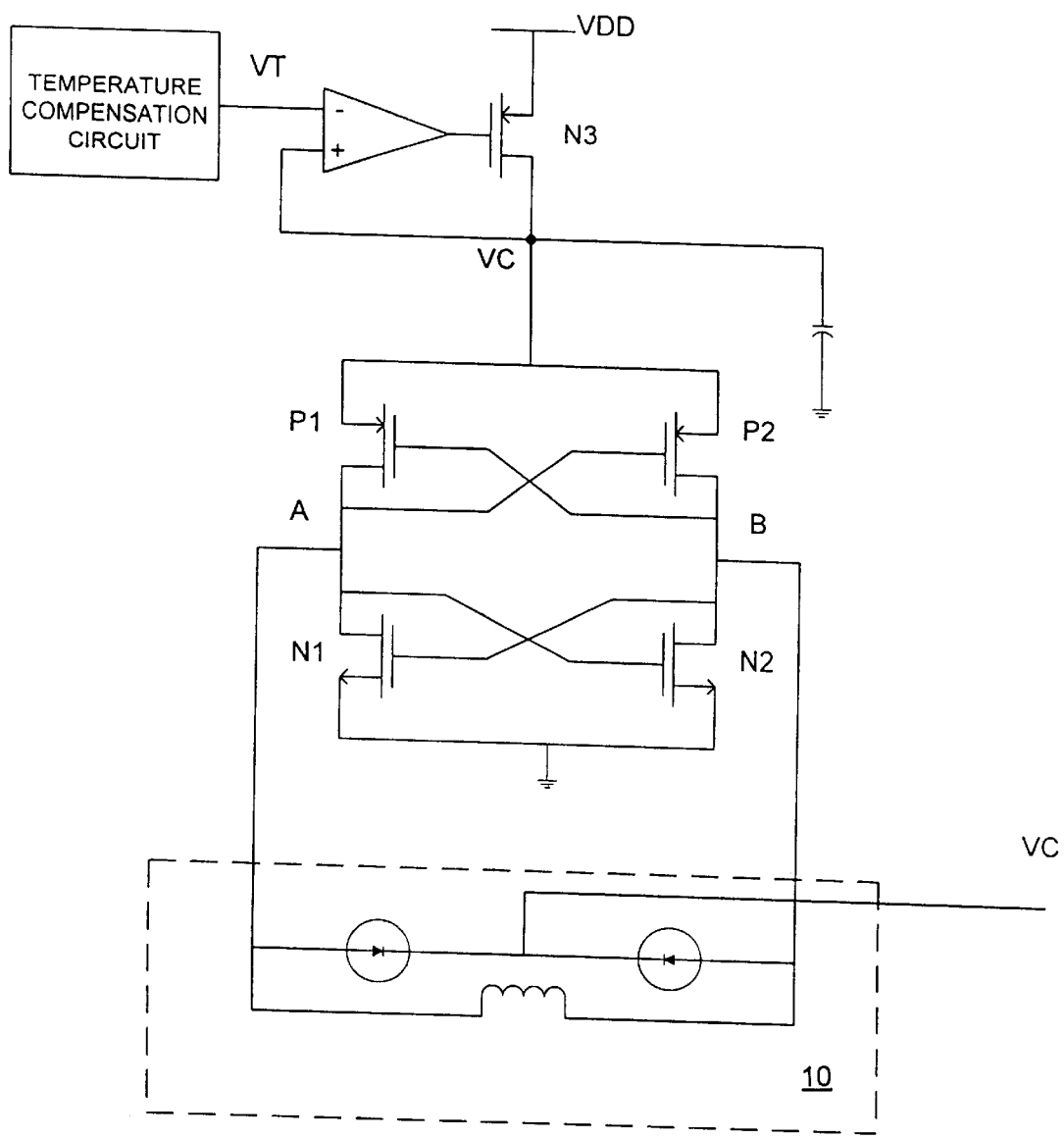
FIG. 6 shows an oscillator with a free running frequency which is stablized with respect to temperature variations with prior art VCO circuit.

The temperature compensation method shown in FIG. 5 can also be used in conjunction with a prior art VCO using varactors as shown in FIG. 6.

While particular embodiments of the invention have been described, it will be apparent to those skilled in the art that various modifications may be made in the embodiments without departing from the spirit of the present invention. Such modifications are all within the scope of this invention.

What is claimed is:

1. A voltage controlled oscillator, comprising:
   a first CMOS inverter and a second CMOS inverter, each having common gates and common drains of complementary MOS transistors used in said first CMOS inverter and said second CMOS inverter,
   the common gates of said first inverter being connected to the common drains of the second inverter and the common gates of said second inverter being connected to the common drains of the first inverter to form a cross-coupled multivibrator
   a parallel resonant circuit having an inductor and a fixed capacitor in parallel connected between the common drains of said first inverter and said common drains of said second inverter to cause oscillation; and
   means to vary by a control voltage the gate to drain capacitance of each CMOS transistor of the first inverter and the second inverter to change the frequency of said oscillation.

2. A voltage controlled oscillator as described in claim 1, wherein said means to vary the gate to drain capacitance is to vary the dc current flowing in the complementary MOS transistors in said first inverter and said second inverter.

3. A voltage controlled oscillator as described in claim 2, wherein the frequency of oscillator decreases as the dc current increases.

4. A voltage controlled oscillator as described I claim 2, wherein said dc current is controlled by a current mirror, the current of which is controlled by said control voltage.

5. A voltage controlled oscillator as described in claim, wherein said dc current is derived from a phase comparator in a phase-locked loop.

6. A voltage controlled oscillator as described in claim 1, wherein said control voltage is temperature sensitive.

7. A voltage controlled oscillator as described in claim 6, wherein said control voltage has a positive temperature coefficient.

8. A voltage controlled oscillator as described in claim 4, wherein said current mirror comprises first PMOS and second PMOS, the drain of said first PMOS connected to the gate of the first PMOS and to a current source, and the gate of the second PMOS connected to the gate of first PMOS and the drain connected to the common sources of said first inverter and said second inverter.

9. A voltage controlled oscillator as described in claim 8, wherein said current source is a NMOS having a gate connected to said control voltage and a drain connected to the gate of said PMOS and a source connected to a ground.

10. A voltage controlled oscillator as described in claim 1, wherein said means to vary by a control voltage is to vary the dc voltage applied across said first inverter and said second inverter.

11. A voltage controlled oscillator as described in claim 10, wherein said control voltage is derived from a voltage follower.

12. A voltage controlled oscillator as described in claim 11, wherein:
   said voltage follower uses an operational amplifier followed by a PMOS transistor,
   the control voltage is applied to the inverting input terminal of the operational amplifier,
   the drain of the PMOS transistor is connected to the non-inverting input of the operational amplifier to supply a dc voltage to said first inverter and said second inverter, and
   the output of the operational amplifier is connected to the gate of the PMOS transistor.

13. A voltage controlled oscillator as described in claim 5, further comprising a second means to vary the frequency of said oscillator as the operating temperature of the oscillator is varied so as to maintain the free running frequency of the oscillator to be constant.

14. A voltage controlled oscillator as described in claim 12, further comprising a temperature sensitive control voltage summed at the inverting terminal of said operational amplifier.

15. A voltage controlled oscillator as described in claim 14, wherein said temperature sensitive control voltage has a negative temperature coefficient.

* * * * *